(12) United States Patent
Gruening-von Schwerin et al.

(10) Patent No.: US 7,727,837 B2
(45) Date of Patent: Jun. 1, 2010

(54) METHOD OF PRODUCING AN INTEGRATED CIRCUIT HAVING A CAPACITOR WITH A SUPPORTING LAYER

(75) Inventors: Ulrike Gruening-von Schwerin, Munich (DE); Rolf Weis, Dresden (DE); Wolfgang Henke, Radebeul (DE); Odo Wunnicke, Dresden (DE); Till Schloesser, Dresden (DE); Florian Schnabel, Hoehenkirchen (DE); Wolfgang Mueller, Radebeul (DE)

(73) Assignee: Qimonda AG, Munich (DE)

( * ) Notice: Subject to any disclaimer, the term of this patent is extended or adjusted under 35 U.S.C. 154(b) by 338 days.

(21) Appl. No.: 11/669,613

(22) Filed: Jan. 31, 2007

(65) Prior Publication Data

US 2008/0182378 A1 Jul. 31, 2008

(51) Int. Cl.
*H01L 21/8242* (2006.01)
*H01L 21/20* (2006.01)
*H01L 21/302* (2006.01)
*H01L 21/461* (2006.01)

(52) U.S. Cl. .................. 438/253; 438/393; 438/717

(58) Field of Classification Search ................. 438/253, 438/396, 717; 257/E21.09
See application file for complete search history.

(56) References Cited

U.S. PATENT DOCUMENTS

| 5,998,100 | A | * | 12/1999 | Azuma et al. ............... 430/313 |
| 6,201,273 | B1 | | 3/2001 | Wang et al. |
| 6,667,502 | B1 | * | 12/2003 | Agarwal et al. ............. 257/296 |
| 7,067,385 | B2 | | 6/2006 | Manning |
| 2005/0245022 | A1 | | 11/2005 | Gutsche et al. |

OTHER PUBLICATIONS

"A Mechanically Enhanced Storage node for virtually unlimited Height (MESH) Capacitor Aiming at sub 70nm DRAMS", by D.H. Kim, et al., IEEE, 2004.
"Novel Robust Cell Capacitor (Leaning Exterminated Ring type Insulator) and New Storage Node Contact (Top Spacer Contact) for 70nm DRAM technology and beyond", by J.M. Park, et al., 2004 Symposium on VLSI Technology, IEEE 2004.

* cited by examiner

*Primary Examiner*—William M. Brewster
(74) *Attorney, Agent, or Firm*—Dicke, Billig & Czaja, PLLC

(57) ABSTRACT

A method of forming an integrated circuit having a capacitor is disclosed. In one embodiment, the method includes forming a capacitor element with a first electrode, a dielectric layer and a second electrode. The capacitor element is formed using a support layer.

25 Claims, 9 Drawing Sheets

METHOD OF PRODUCING AN INTEGRATED CIRCUIT HAVING A CAPACITOR WITH A SUPPORTING LAYER

BACKGROUND

The present invention provides a method for producing an integrated circuit including forming a capacitor element using a supporting layer.

Conventional semiconductor memories have memory cells that are arranged on a substrate, the memory cells having capacitor elements. The capacitor element may include a bottom plate covered by a dielectric layer. The dielectric layer is covered with a top plate. The capacitor may have the structure of a cylinder capacitor, the structure of a cup capacitor or the structure of a block capacitor. The need for higher integration of memory cells results in capacitor elements covering a smaller area of the substrate. As a result, the capacitor elements are formed by structures that extend from the substrate in a vertical direction up to a maximum height that can be attained by fabricating the capacitor elements. The horizontal area of the substrate is limited and therefore the capacitor elements are fabricated with a high aspect ratio. Furthermore, dielectric material is used having a high k coefficient in order to provide a large amount of electrical charge which can be stored in a small capacitor element. Because of the small sizes of the capacitors, there is a need to improve the method of forming the capacitor element.

SUMMARY

One embodiment provides a method of producing an integrated circuit having a capacitor element with a first electrode, a dielectric layer and a second electrode. One embodiment includes depositing a sacrificial layer on a substrate, forming recesses in the sacrificial layer, depositing the first electrodes in the recesses, and depositing a supporting layer on the sacrificial layer and the first electrodes with at least one opening in the supporting layer, the supporting layer being connected with the first electrodes stabilizing the first electrodes.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a method of forming capacitor elements with a first electrode, a dielectric layer and a second electrode with the following processes: a substrate is provided and a sacrificial layer is deposited on the substrate. Recesses are formed in the sacrificial layer and first electrodes are deposited in the recesses. A supporting layer is formed on the sacrificial layer and the first electrodes with at least one opening. The supporting layer is deposited in contact with the first electrodes. The supporting layer stabilizes the first electrodes during an at least partial removal of the sacrificial layer. Then the supporting layer is removed. After this process the dielectric layers and the second electrodes are deposited on the first electrodes completing the capacitor elements.

A further embodiment provides a method of forming capacitor elements with a first electrode, a dielectric layer and a second electrode with the processes: providing a substrate and forming a sacrificial layer on the substrate. Forming a supporting layer on the sacrificial layer. Forming recesses in the sacrificial layer and the supporting layer. After this the first electrodes are deposited in the recesses of the sacrificial layer, wherein the supporting layer is connected with the first electrodes. An opening is formed beside the first electrodes in the supporting layer and the sacrificial layer is at least partially removed, wherein the first electrodes are stabilized by the supporting layer. Then the supporting layer is removed and the dielectric layers and the second electrodes are deposited on the first electrodes completing the capacitor elements.

A further embodiment provides a method of producing an integrated circuit with capacitor elements with a first electrode, a dielectric layer and a second electrode with the processes: forming a sacrificial layer on the substrate; forming a supporting layer on the sacrificial layer; forming the first electrode in the sacrificial layer and the supporting layer; forming an opening in the supporting layer; removing at least partially the sacrificial layer; the first electrodes being stabilized by the supporting layer; removing the supporting layer; forming the dielectric layer and the second electrode completing the capacitor element.

The present invention relates to a method of forming a capacitor element. More particularly, the invention relates to a method of forming an integrated circuit with a capacitor element and producing an integrated circuit having a memory including a capacitor.

The present invention may be described in terms of various functional components. It should be appreciated that such functional components may be realized by any number of hardware or structural components configured to perform the specified functions. For example, the present invention may employ various integrated components comprised of various electrically devices, such as resistors, transistors, capacitors, diodes and such components, the behaviour of which may be suitably configured for various intended purposes. In addition, the present invention may be practised in any integrated circuit application where an effective reversible polarity is desired. Such general applications may be appreciated by those skilled in the art in light of the present disclosure are not described in detail. Further, it should be noted that various components may be suitably coupled or connected to other components within exemplary circuits, and that such connections and couplings can be realized by direct connection between components and by connections through other components and devices located in between.

Figure 1:
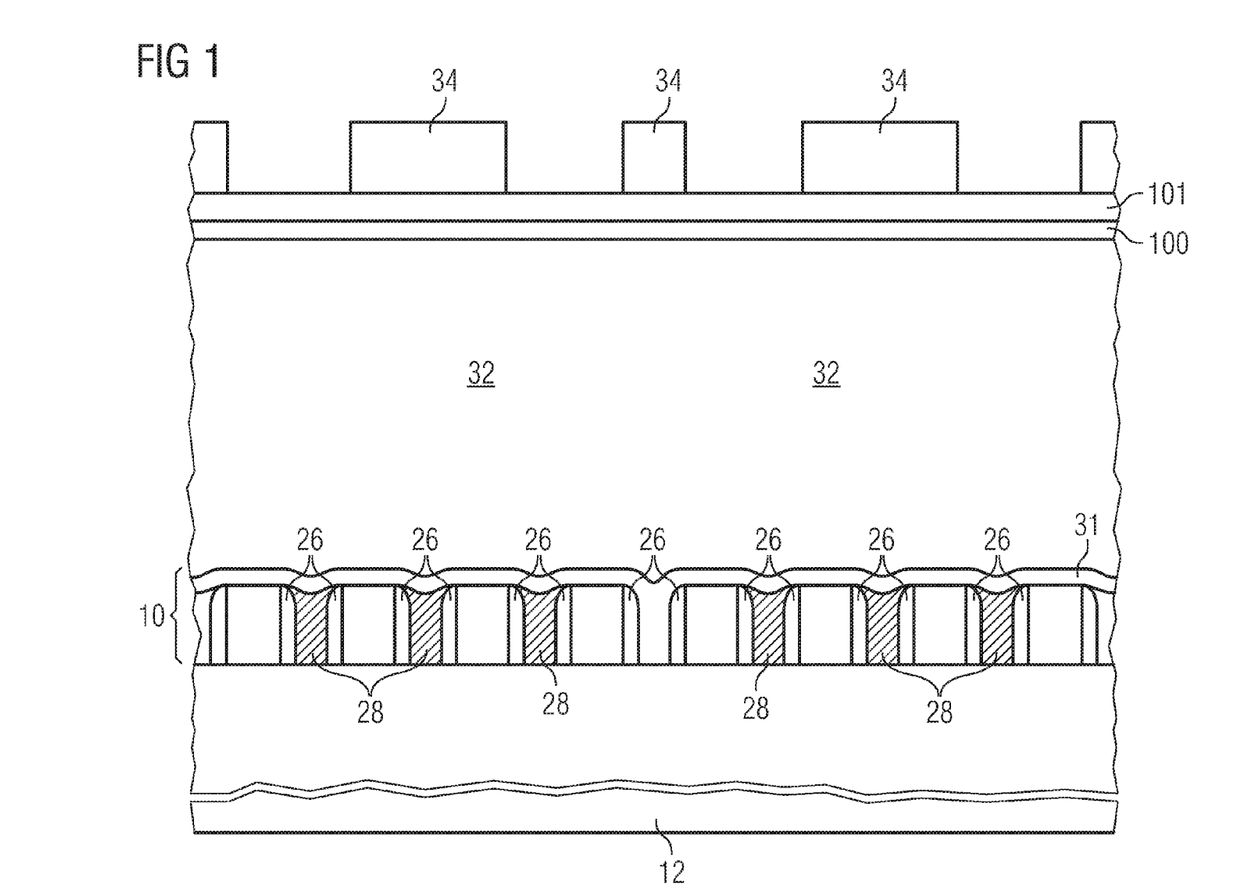
FIG. 1 illustrates a schematic drawing of a first process.

FIGS. 1 to 7 illustrate a first method for forming a plurality of capacitors, for example in cylindrical shape for an integrated circuit, for example, a memory circuit. FIG. 1 illustrates a wafer 12 having layer 10 having a plurality of contact pads 28 in an upper region of the layer 10. Silicon nitride spacers 26 may be formed for insulating the contact pads 28 to which the cylinder capacitors will be electrically coupled from the layer 10. The contact pads 28 may be electrically connected to conductors for example to bit lines of a memory circuit that are not illustrated for clarity. The layer 10 may be formed by a semiconductor material, for example, silicon. The contact pads 28 may be formed by polysilicon or metal. An etch stop layer 31, for example, made of silicon nitride is formed on the layer 10. A sacrificial layer, for example a thick layer of deposited oxide layer 32, e.g., made of boron phosphor silicate glass (BPSG), is formed to provide a base insulation layer, i.e., a dielectric layer for the capacitor features that will be formed later. The oxide layer may also be formed of USG, TEOS, PSG or combinations of BPSG, USG, TEOS and PSG.

On oxide layer 32 a supporting layer 100 is deposited. On the supporting layer 100 a further layer 101 is deposited. The supporting layer may be made of material that can be selectively etched relative to the oxide layer 32 that is used at least partially as a sacrificial layer. The further layer 101 may be used as a hard mask for a structuring process of the supporting layer 100. The further layer may for example be made of silicon nitride or silicon oxynitride.

The supporting layer 100 may be for example at least partially made of carbon. The carbon layer may be deposited by a plasma enhanced chemical vapour deposition using $C_3H_8$ as a precursor with $N_2$ as plasma gas. The nitrogen concentration is selected at the start of the deposition of the carbon layer to attain a contact layer with a nitrogen concentration of 5%. After forming a contact layer the nitrogen gas is stopped and the carbon layer is completed with a thickness between 0.01 μm and 1 μm. The further layer 101 may be made of polysilicon or silicon oxynitride. A patterned photoresist layer 34 defines the location of the capacitors to be formed. The FIG. 1 structure may further include one or more bit lines under the oxide layer 32 or various other structural elements or differences which, for simplicity of explanation, have not been illustrated. In a further embodiment instead of a wafer 12 with a layer 10 a simple substrate with contact pads 28 or a layer with contact pads may be used. Depending on the embodiment the contact pads may be connected with a conductor lines or a conducting areas of the substrate.

The FIG. 1 structure is subjected to an anisotropic etch which removes the exposed portions of the further layer 101, of the supporting layer 100 and of the oxide layer 32 to expose the etch stop layer 31 and forms a patterned further layer 101, a patterned supporting layer 100 and a patterned oxide layer 32 which provide a base dielectric having recesses for forming the capacitors.

Figure 2:
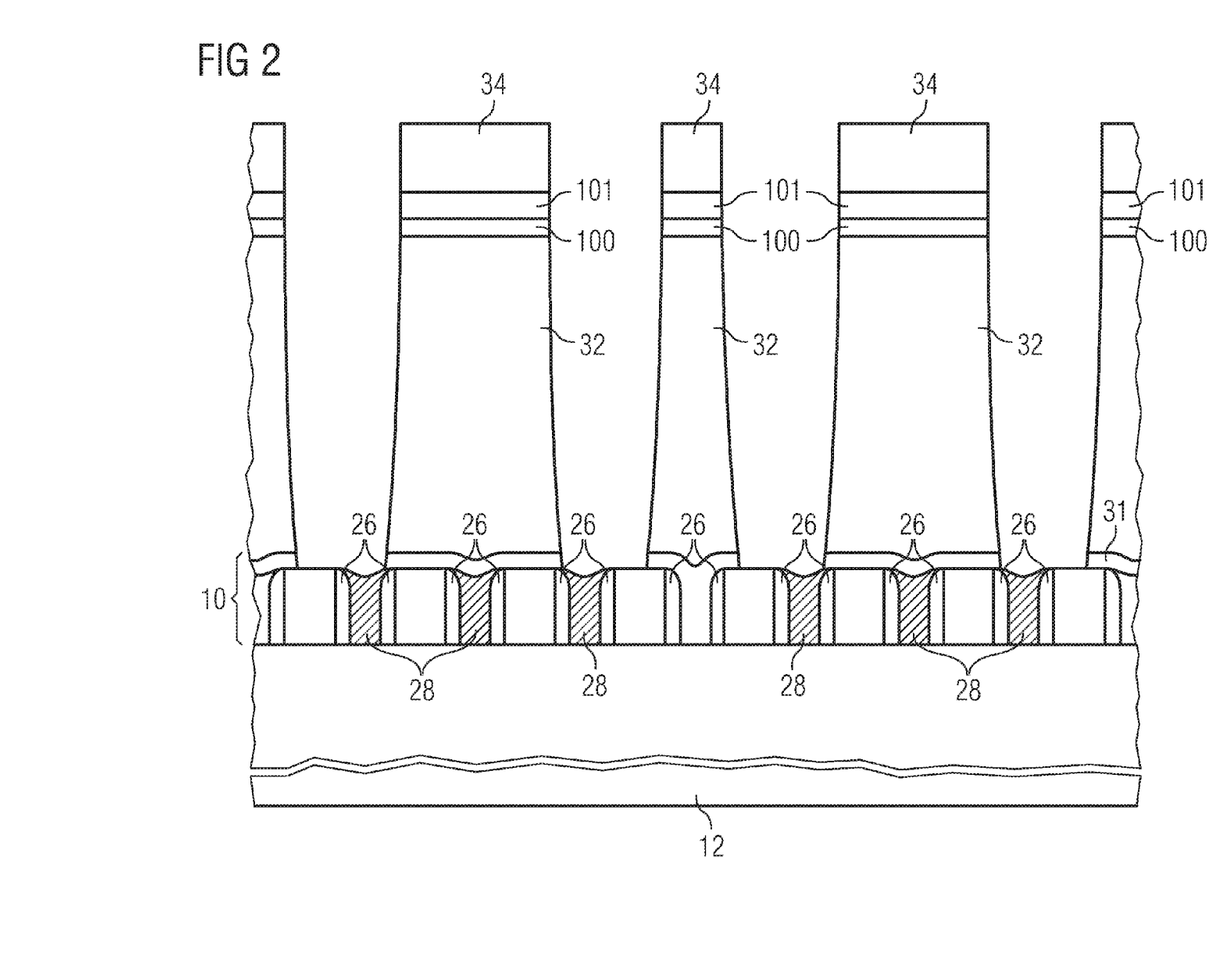
FIG. 2 illustrates a schematic drawing of a second process.
Figure 3:
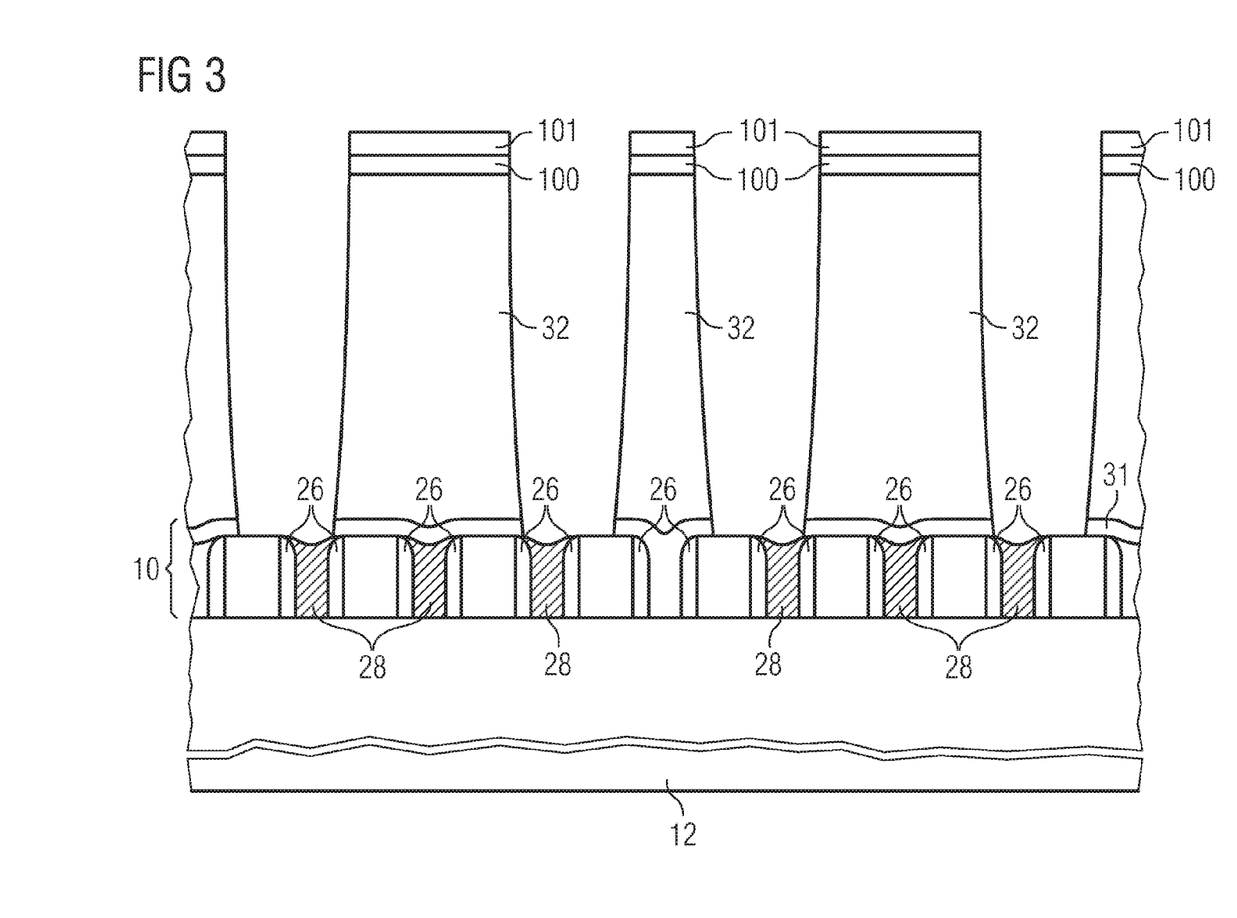
FIG. 3 illustrates a schematic drawing of a third process.

The exposed portion of the etch stop layer 31 is then removed. Subsequent to the etch of the etch stop 31, the contact pads 28 are exposed to result in a structure as illustrated in FIG. 2. The remaining photoresist layer 34 is stripped and any polymer (not illustrated) that forms during the etch is removed according to means known in the art to provide a structure as illustrated in FIG. 3.

Figure 4:
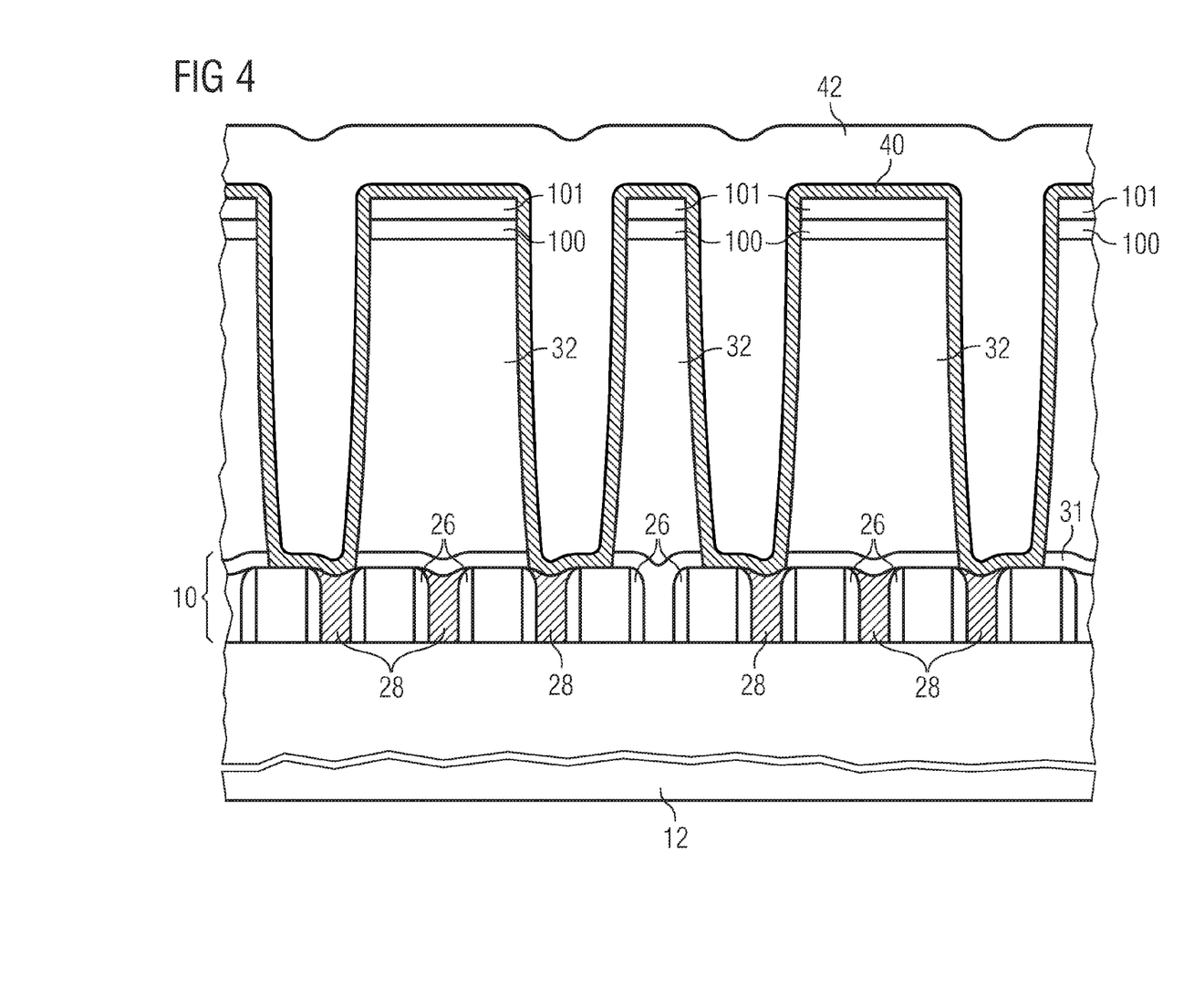
FIG. 4 illustrates a schematic drawing of a fourth process.
Figure 5:
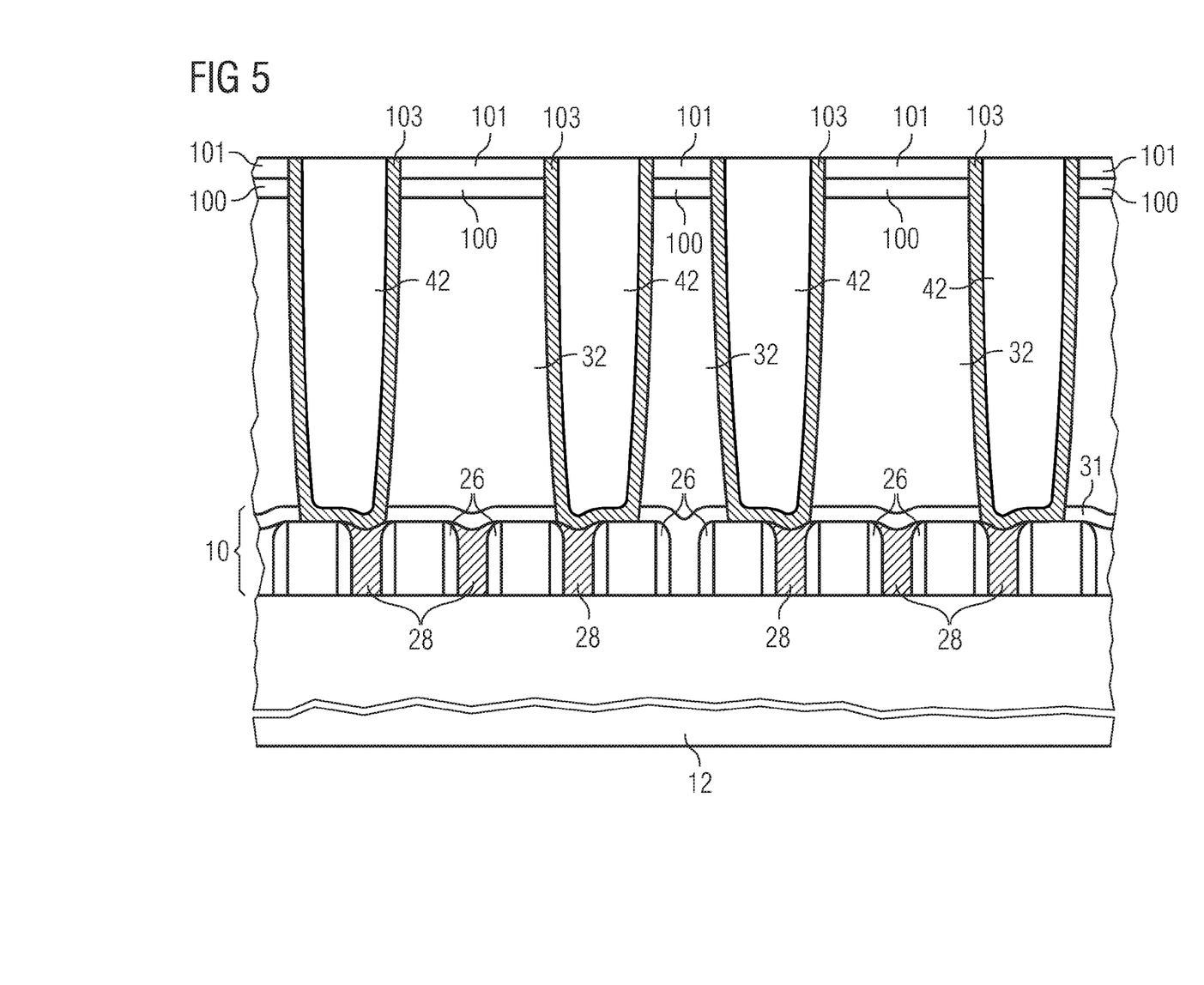
FIG. 5 illustrates a schematic drawing of a fifth process.

As illustrated in FIG. 4, a conductive layer 40 such as metal or polysilicon or another material is formed conformal with the deposited oxide layer, and will provide capacitor bottom electrodes for the completed capacitors. A sacrificial material 42, such as photoresist or silicon oxide, is formed, to overfill the cylinders provided by the cylindrical shapes of the conductive layer 40. The FIG. 4 structure is then subjected to a planarizing process such as a chemical planarization, a mechanical planarization, or a chemical-mechanical planarization step. During the planarization, upper parts of the photoresist 42 and upper parts of the conductive layer 40 and usually an upper portion of the further layer 101 are removed resulting in a structure as illustrated in FIG. 5 with several separated cup shaped bottom plates as first electrodes 103.

Figure 6A:
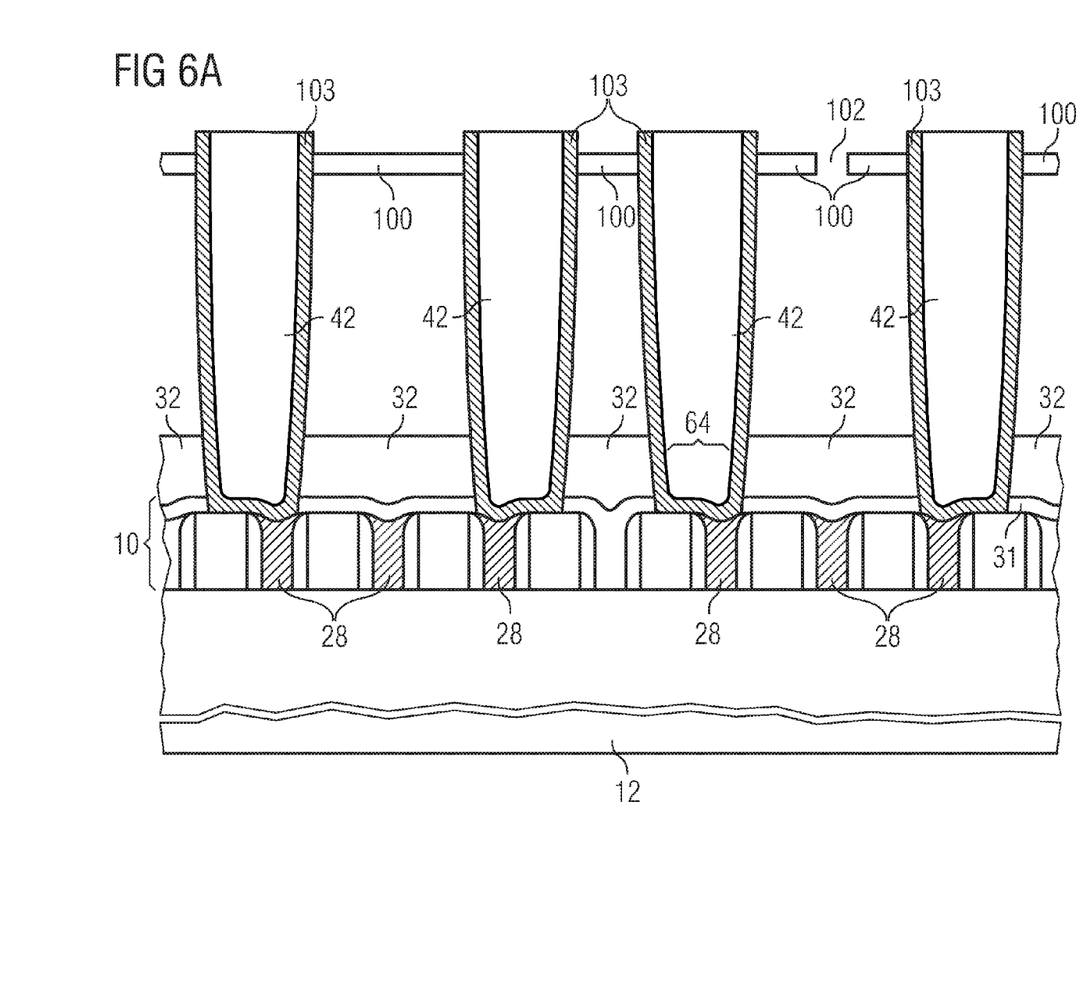
FIG. 6 illustrates a schematic drawing of a sixth process.

In a following process, the further layer 101 is used as a hard mask and the supporting layer 100 is opened in at least one opening 102. The further layer 101 may be completely removed before the following etch process. Then the oxide layer 32 is at least partially etched via the opening 102 with a wet etch, for example with HF (hydrogen fluoride) selective to the first electrodes 103 to result in a structure as illustrated in FIG. 6A with several bottom plates as first electrodes 103 that are still connected and stabilized by the supporting layer 100. If the further layer 101 may not be removed before the etch process, the further layer 101 may be removed during or after the etch process.

Figure 6B:
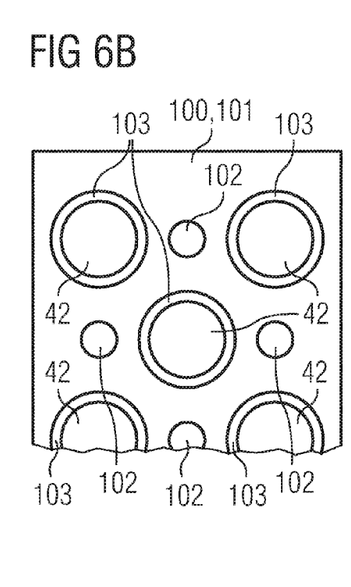

FIG. 6B illustrates a top view on FIG. 6A, whereby several openings 102 are arranged in the supporting layer 100 and, depending on the embodiment, in the further layer 101 and in the supporting layer 100. The supporting layer 100 and the further layer 101 may be arranged as a closed net structure with the openings 102. Depending on the embodiment, the supporting layer 100 and the further layer 101 may be formed as a ring net structure with ring elements that are connected with the first electrodes 103, whereby the ring elements are connected together to a net structure. The ring net structure supports and stabilizes mechanically the first electrodes 103 connecting the first electrodes during the etching process of the oxide layer 32. The supporting layer 100 and the further layer are connected with ring faces to the first electrodes 103. The supporting layer 100 is arranged at an upper end region of the first electrodes 103. The opening 102 is arranged between two first electrodes 103 providing an access to the oxide layer 32 that is used at least partially as a first sacrificial layer. Depending on the used embodiment the further layer 101 is removed before the etching of the oxide layer 32, then only the supporting layer 100 stabilizes the first electrodes 103 during the etching of the oxide layer 32.

The structure of the first electrodes 103 basically has the shape of a cup with a bottom face. The sidewalls of the cup are vertically oriented and the bottom face of the cup is horizontally oriented and electrically coupled to a contact pad 28, for example the first electrode 103 is in direct contact with the contact pad 28.

In a following process, the supporting layer 100 is removed totally. For removing the supporting layer 100 for example a dry etch process is used. For the dry-etch process, a gas or a gas plasma may use a forming gas including nitrogen and hydrogen. In one embodiment, the gas plasma gas does not include oxygen. In a further embodiment, the supporting layer at least partially including carbon may be removed by a carbon ashing process. For the carbon ashing process oxygen plasma may be used with a temperature lower than 250° C., for example 60° C. By the ashing process the carbon layer is basically converted to $CO_2$ gas.

The sacrificial material 42 is removed by an etching process after the etching of the oxide layer 32. The sacrificial 42 may be removed before or after the removal of the further layer 101 and/or the removal of the supporting layer 100.

Figure 7:
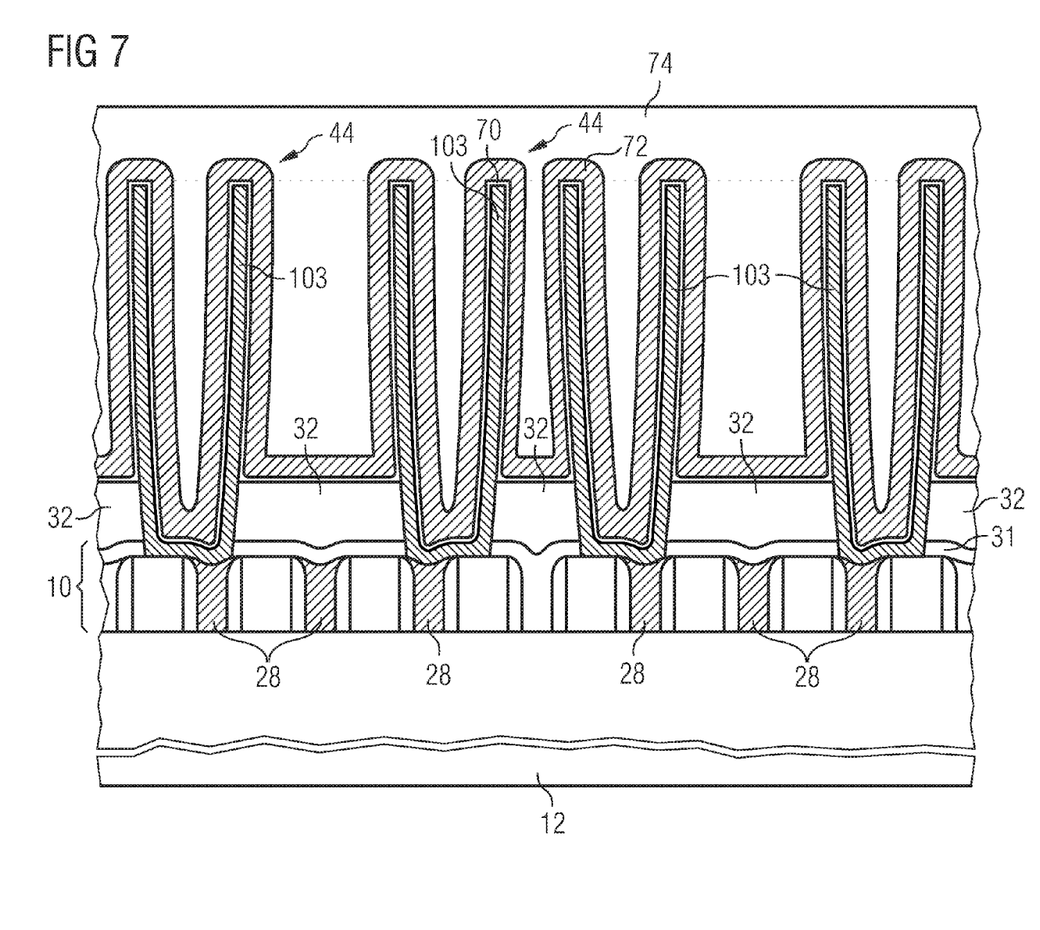
FIG. 7 illustrates a schematic drawing of a seventh process.

Next, a dielectric layer 70, e.g., a layer of high quality nitride, and an electrically conductive layer as a top second electrode 72 are formed at an inner side and an outer side of the first electrode 103, as illustrated in FIG. 7. The dielectric layer may also be made of a high k-coefficient material. The structure is filled up with a further dielectric material 74 that is electrically insulating. This forms a double-sided cylinder capacitor as both the capacitor dielectric layer 70 and the second electrode 72 follow the contours of the majority of both the inside face and the outside face of the first electrode 103. According to this process, several capacitor elements having a first electrode, dielectric layer and a second electrode are formed.

Depending on the embodiment, use may also be made of a cylinder capacitor with a one-sided shape, meaning that the dielectric layer 70 and the second electrode 72 are only disposed on an inner face or on an outer face of the cup shape of the first electrode 103.

The first electrodes 103, the dielectric layers 70 and the second electrodes 72 constitute cylinder capacitors 44. In further processes, that are not explicitly illustrated in the Figures the capacitors 44 may be used for fabricating an integrated circuit, for example memory cells with capacitors for a memory circuit. As a memory circuit for example a DRAM memory may be fabricated.

Figure 8:
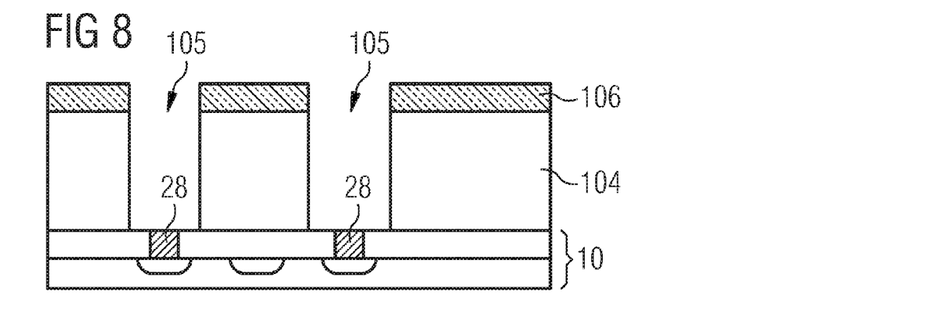
FIG. 8 illustrates a schematic drawing of a first process of a further process.

FIGS. 8 to 15 illustrate a further process of forming a capacitor. FIG. 8 illustrates a layer 10 with a second sacrificial layer 104, that provides second recesses 105. The layer 10 may include a substrate layer made of semiconductor material. The second sacrificial layer 104 is covered with a hard mask 106. The hard mask 106 may be formed as a carbon layer or may include at least partially carbon. In a further embodiment the hard mask 106 may be made of silicon oxide, silicon nitride or silicon oxynitride. The recesses 105 extend to a surface of the substrate 10, whereby in the layer 10 a contact pad 28 is arranged. A face of the contact pad 28 is adjacent arranged to the recess 105. Depending on the embodiment, the contact pad 28 may be connected with a source or drain region of a transistor as explained for the embodiment of FIG. 1. For the further description of this embodiment, the layer 10 may be realised as a semiconductor wafer with a layer. However, instead of the wafer also a simple substrate with contact pads 28 or a layer with contact pads may be provided. The contact pads 28 can be connected with a conductor line or with conductive areas, or with electric circuits that may be arranged on or in the substrate. For example, bit lines and word lines of a memory circuit may be arranged in the layer 10 and may be connected with the contact pads 28.

The second sacrificial layer 104 may be formed as a silicon oxide layer, that is deposited by a chemical wafer deposition process. The silicon oxide may be deposited at a temperature below 500° C. Depending on the embodiment, plasma enhancement may be used for lowering the depositing temperature beneath 500° C. In another embodiment the second sacrificial layer 104 may be made of BPSG, USG, TEOS, PSG or combinations thereof.

Figure 9:
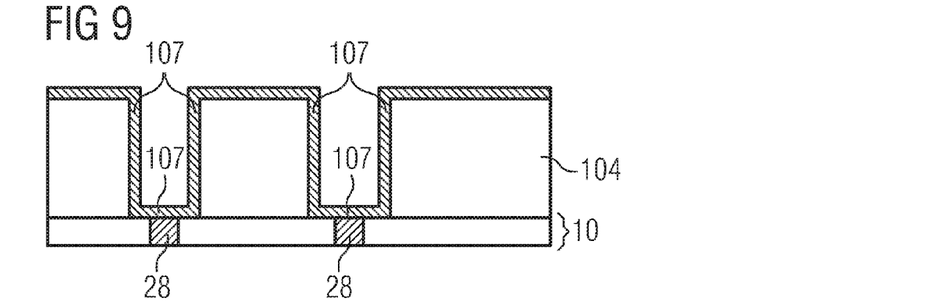
FIG. 9 illustrates a schematic drawing of a second process of a further process.

In a further process, as illustrated in FIG. 9, the hard mask 106 is removed by an etching process from the surface of the second sacrificial layer 104. In a further process step, a second conductive layer 107 is deposited on the surface of the second sacrificial layer 104 and the free surface of the substrate 10 in the recesses 105 and the free surface of the contact pads 28. The second conductive layer 107 may be made of poly-silicon or metal.

Figure 10:
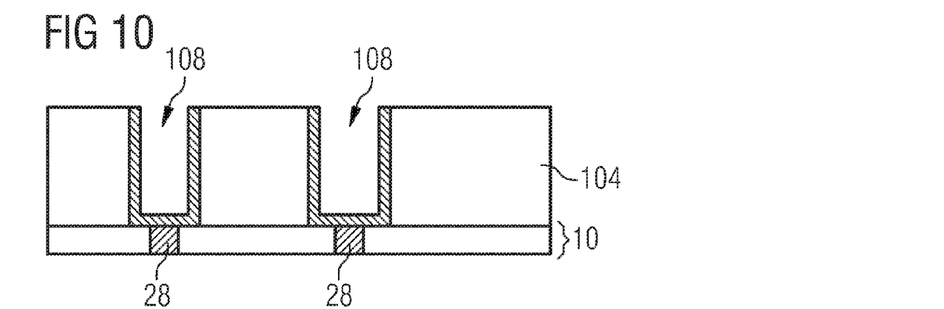
FIG. 10 illustrates a schematic drawing of a third process of the further process.

In a further process an upper part of the arrangement is removed by, for example, a chemical mechanical polishing process, resulting in an arrangement with several separated first further electrodes 108 that are arranged in the recesses 105 of the second sacrificial layer 104 as illustrated in FIG. 10. Depending on the embodiment, the recesses 105 may be filled after the deposition of the second conductive layer 107 and prior to the removal of the upper part of the arrangement. After the removal of the upper part resulting in separate further first electrodes 108, the filling is removed. The further first electrodes 108 are electrically connected to the contact pads 28. The further first electrodes 108 may basically have the shape of a cup with a horizontal base-plate and a vertical sleeve-element.

Figure 11:
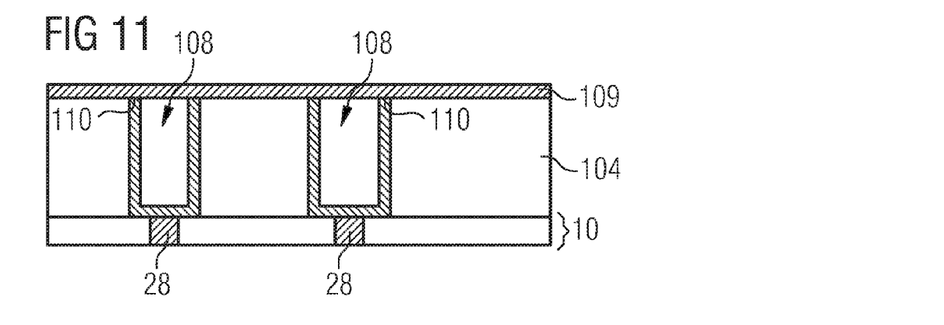
FIG. 11 illustrates a schematic drawing of a fourth process of the further process.
Figure 12:
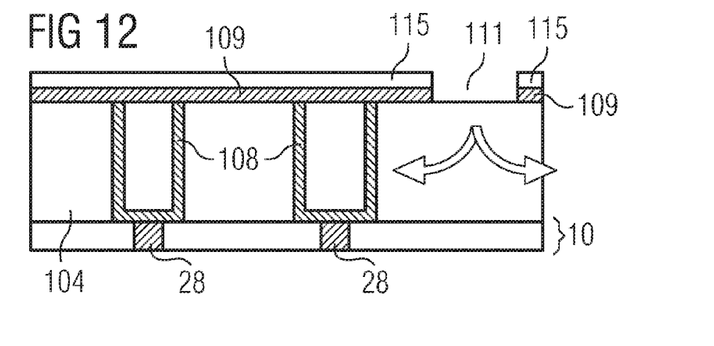
FIG. 12 illustrates a schematic drawing of a fifth process of the further process.
Figure 13:
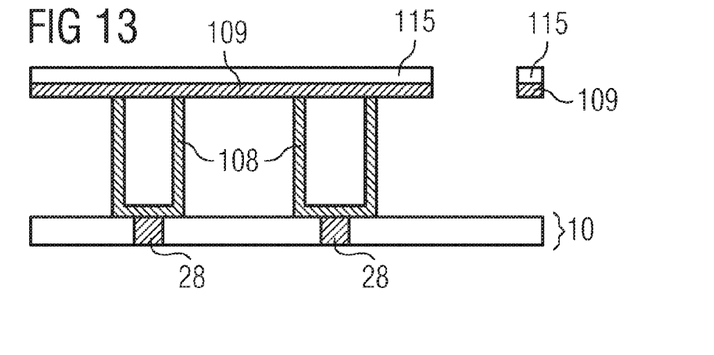
FIG. 13 illustrates a schematic drawing of a sixth process of the further process.

In a further process, a further supporting layer 109 is deposited on the second sacrificial layer 104, covering the further first electrodes 108. The further supporting layer 109 may be for example at least partially made of carbon. In a further embodiment, the further supporting layer 109 may be made of carbon. The carbon layer may be deposited by a plasma enhanced chemical vapour deposition using $C_3H_8$ as a precursor with $N_2$ as plasma gas. The nitrogen concentration is selected at the start of the deposition of the carbon layer to attain a contact layer with a nitrogen concentration of 5%. After forming a contact layer the nitrogen gas is stopped and the carbon layer is completed with a thickness between 0.01 μm and 1 μm. In one embodiment, the carbon layer may have a thickness between 15 and 75 nm. The further supporting layer 109 is mechanically connected with upper end faces 110 of the further first electrodes 108, as it is illustrated in FIG. 11. In one embodiment the further supporting layer 109 is formed as a planar layer. In a further process step, as illustrated in FIG. 12, a further hard mask 115 is deposited on the further supporting layer 109. A further opening 111 is formed in the further supporting layer 109 beside a further first electrode 108. Via the further opening 111, the second sacrificial layer 104 is removed by an etching process for example by a wet etching process. For example hydrogen fluoride is used as etching media. As a result, as illustrated in FIG. 13, an arrangement with several further first electrodes 108 is attained, that are covered and connected by the further hard mask 115 and the further supporting layer 109.

Figure 14:
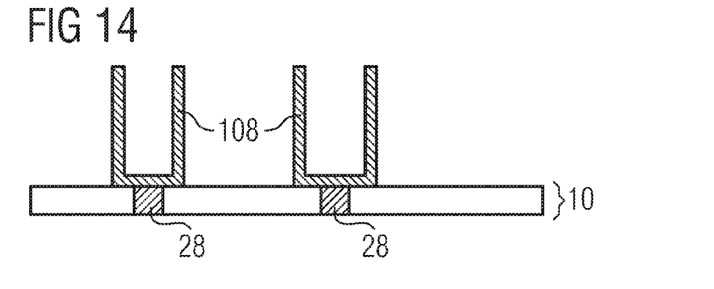
FIG. 14 illustrates a schematic drawing of a seventh process of the further process.

In a following process, the further hard mask 115 and the further supporting layer 109 are removed, for example, by a dry etching process. Depending on the material of the further hard mask 115 and the used wet etching media, the further hard mask 115 may be at least partially or totally removed by the wet etching process that is used for removing the second sacrificial layer 104. The further hard mask may be made of silicon oxide, silicon nitride, or silicon oxynitride. The wet etching media may be hydrogen fluoride (HF). In one embodiment, the further supporting layer 109 and the further hard mask 115 may be removed by an ashing process. For the ashing process, oxygen plasma may be used with a temperature lower than 250° C., for example 60° C. By the ashing process the carbon of the supporting layer is basically converted to $CO_2$ gas. Thus, several free standing further first electrodes 108 are attained as illustrated in FIG. 14. For the dry etching media, a gas or a plasma gas may be used. The gas or plasma gas may be a forming gas including basically nitrogen and hydrogen. In one embodiment, the dry etching media does not include oxygen. Low temperature and/or no or low oxygen concentration in the dry etching media reduces the oxidation of the further first electrodes 108.

Figure 15:
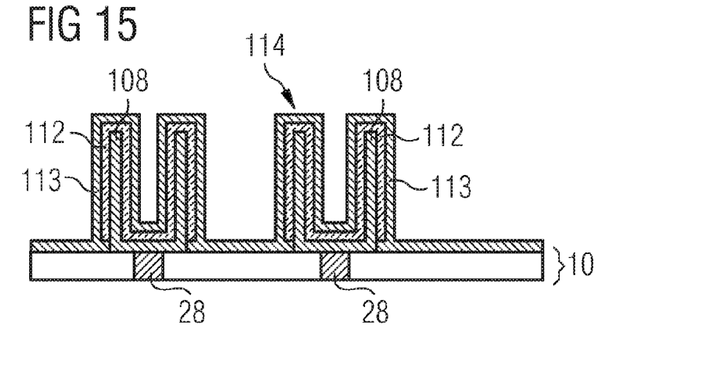
FIG. 15 illustrates a schematic drawing of an eighth process of the further process.

In a further process step, a further dielectric layer 112 is deposited on the further first electrodes 108. Furthermore, a further second electrode layer 113 is deposited on the further dielectric layer 112. This arrangement is illustrated in FIG. 15. The further first electrodes 108, the further dielectric layer 112, and the further second electrode layer 113 constitute a further capacitor element 114, that may be processed with further process steps, for example for fabricating a memory element or an integrated circuit, having a further capacitor element 114 or a memory circuit with a further capacitor element 114 as a part of a memory cell. The memory circuit may for example be constructed as a dynamic random access memory.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing an integrated circuit having a capacitor element with a first electrode, a dielectric layer and a second electrode comprising:
   depositing a sacrificial layer on a substrate;
   forming recesses in the sacrificial layer;
   depositing the first electrodes in the recesses;
   depositing a supporting layer on a planar surface of the sacrificial layer and the first electrodes, the supporting layer being connected with the first electrodes stabilizing the first electrodes;
   forming openings in the supporting layer beside the first electrodes such that the supporting layer remains over the first electrodes;
   removing at least partially the sacrificial layer through the openings;
   removing the supporting layer with a dry etching process; and
   forming the dielectric layer and the second electrode completing the capacitor element.

2. The method of claim 1, wherein the first electrodes are formed in a cup shape.

3. The method of claim 1, wherein the supporting layer comprises carbon.

4. The method of claim 1, wherein the supporting layer is deposited over the first electrodes covering the first electrodes.

5. The method of claim 1, comprising:
   forming the first electrodes in cup shapes;
   depositing the supporting layer on upper end faces of the first electrodes covering the first electrodes; and
   removing at least partially the sacrificial layer by a wet etching process.

6. The method of claim 1, wherein the supporting layer is deposited on the sacrificial layer adjacent to upper end faces of the first electrodes connecting at least two first electrodes of two capacitor elements.

7. The method of claim 1, further comprising:
   filling the recesses with a sacrificial material; and
   removing the sacrificial material before depositing the dielectric layers on the first electrodes.

8. The method of claim 1, wherein the sacrificial layer is removed by a wet etching process.

9. The method of claim 1, wherein the supporting layer is removed at a temperature lower than 250° C.

10. The method of claim 9, wherein the supporting layer is removed with an oxygen-free gas.

11. The method of claim 1, further comprising depositing a further layer on the supporting layer, using the further layer as a hard mask for structuring the supporting layer.

12. A method of forming a semiconductor memory having capacitor elements with first electrodes, dielectric layers and second electrodes, the method comprising:
   depositing a sacrificial layer on a substrate;
   forming recesses in the sacrificial layer;
   depositing the first electrodes in the recesses;
   depositing a supporting layer on a planar surface of the sacrificial layer and the first electrodes, forming at least one opening in the supporting layer beside the first electrodes such that the supporting layer remains over the first electrodes, the supporting layer being connected with the first electrodes stabilizing the first electrodes;
   removing at least partially the sacrificial layer via the opening;
   removing the supporting layer; and
   forming the dielectric layer and the second electrode completing the capacitor element of the semiconductor memory.

13. The method of claim 12, wherein the first electrodes are formed in a cup shape.

14. The method of claim 12, wherein the supporting layer comprises carbon.

15. The method of claim 12, wherein the supporting layer is deposited over the first electrodes covering the first electrodes.

16. The method of claim 12, wherein the first electrodes are formed in cup shapes, wherein the supporting layer is deposited on upper end faces of the first electrodes covering the first electrodes, wherein the sacrificial layer is removed by a wet etching process, and wherein the supporting layer is removed by a dry etching process.

17. The method of claim 12, further comprising after depositing the first electrodes:
   filling the recesses with a sacrificial material;
   removing sacrificial material from the first electrodes before forming the dielectric layer on the first electrodes, wherein the supporting layer is deposited on the sacrificial layer before forming the recesses in the supporting layer and the sacrificial layer.

18. A method of forming capacitor elements with first electrodes, dielectric layers, and second electrodes, the method comprising:

providing a substrate comprising first electrodes formed in recesses in a sacrificial layer, wherein a supporting layer is arranged above a planar surface of the sacrificial layer;

forming an opening in the supporting layer beside the first electrodes such that the supporting layer remains above the first electrodes;

removing at least partially the sacrificial layer through the opening, wherein the first electrodes are stabilized by the supporting layer;

removing the supporting layer; and forming the dielectric layer and the second electrode completing the capacitor element.

19. The method of claim 18, wherein the first electrodes are formed in a cup shape.

20. The method of claim 18, wherein the supporting layer comprises carbon.

21. The method of claim 18, wherein the supporting layer is formed after the first electrodes and is in contact with the first electrodes, and wherein the supporting layer connects at least two first electrodes.

22. The method of claim 18, wherein providing the substrate comprises:
depositing the sacrificial layer;
forming recesses in the sacrificial layer
forming the first electrodes in the recesses; and
covering the first electrodes with a further sacrificial material.

23. The method of claim 18, wherein providing the substrate comprises:
depositing the sacrificial layer;
depositing the supporting layer on the sacrificial layer;
forming the recesses in the supporting layer and the sacrificial layer; and
then depositing the first electrodes in the recesses in contact with the sacrificial layer and the supporting layer.

24. The method of claim 18, wherein the supporting layer comprises carbon, and wherein removing the supporting layer comprises a carbon ashing process.

25. A method of producing an integrated circuit having a memory with capacitor elements including a first electrode, a dielectric layer and a second electrode comprising:

providing a substrate comprising first electrodes formed in recesses in a sacrificial layer, wherein a supporting layer is arranged above a planar surface of the sacrificial layer;

forming an opening in the supporting layer beside the first electrodes such that the supporting layer remains above the first electrodes;

removing at least partially the sacrificial layer through the opening, the supporting layer supporting the first electrodes during the removal of the sacrificial layer;

removing the supporting layer; and depositing the dielectric layers and the second electrodes on the first electrodes completing the capacitor elements for memory.

* * * * *